United States Patent [19]
You et al.

[11] Patent Number: 5,977,643
[45] Date of Patent: Nov. 2, 1999

[54] CHIP-SIZE SEMICONDUCTOR PACKAGE

[75] Inventors: Joong Ha You; Ki Bon Cha, both of Choongcheongbuk-Do, Rep. of Korea

[73] Assignee: LG Semicon Co., Ltd., Cheongju, Rep. of Korea

[21] Appl. No.: 08/877,566

[22] Filed: Jun. 17, 1997

[30]     Foreign Application Priority Data

Jun. 20, 1996 [KR]   Rep. of Korea ....................... 96-22507

[51] Int. Cl.⁶ ........................... H01L 23/48; H01L 23/58; H01L 23/495
[52] U.S. Cl. ........................ 257/784; 257/786; 257/698; 257/696; 257/781
[58] Field of Search ................................. 257/666, 787, 257/676, 692, 672, 668, 686, 737, 738, 786, 698, 696, 734, 778, 780, 781, 784; 124/52.4; 438/616, 613, 108

[56]                 References Cited

U.S. PATENT DOCUMENTS

| | | | |
|---|---|---|---|
| 4,818,728 | 4/1989 | Rai et al. ................................. | 438/108 |
| 5,143,865 | 9/1992 | Hideshima et al. ..................... | 438/615 |
| 5,554,887 | 9/1996 | Sawai et al. ............................. | 257/737 |
| 5,559,372 | 9/1996 | Kwon ....................................... | 257/692 |
| 5,567,981 | 10/1996 | Bharsali et al. ......................... | 257/781 |
| 5,600,180 | 2/1997 | Kusaka et al. ........................... | 257/737 |
| 5,604,379 | 2/1997 | Mori ........................................ | 257/738 |
| 5,643,802 | 7/1997 | Yamashita ............................. | 228/110.1 |
| 5,654,584 | 8/1997 | Fujitsu .................................... | 257/666 |
| 5,656,863 | 8/1997 | Yasunaga et al. ....................... | 257/787 |
| 5,744,382 | 4/1998 | Kitayama et al. ....................... | 438/613 |
| 5,757,078 | 5/1998 | Matsuda et al. ........................ | 257/778 |
| 5,759,873 | 6/1998 | Kata et al. ............................... | 438/118 |
| 5,786,271 | 7/1998 | Ohrda et al. ............................. | 257/778 |
| 5,834,366 | 11/1998 | Akram ..................................... | 438/613 |
| 5,844,304 | 12/1998 | Kata et al. ............................... | 257/786 |
| 5,849,608 | 12/1998 | Abe ......................................... | 438/613 |

FOREIGN PATENT DOCUMENTS

| | | | |
|---|---|---|---|
| 52-38884 | 3/1977 | Japan ..................................... | 257/738 |
| 4-280633 | 10/1992 | Japan ..................................... | 257/738 |
| 4-294556 | 10/1992 | Japan ..................................... | 257/738 |
| 6-37094 | 2/1994 | Japan ..................................... | 257/737 |
| 6-151440 | 5/1994 | Japan . | |
| 8-55856 | 2/1996 | Japan . | |

OTHER PUBLICATIONS

"Semicon Japan '94 Symposium", Mitsubishi Electric, Dec. 23, 1994.

*Primary Examiner*—Alexander O. Williams
*Attorney, Agent, or Firm*—Fleshner & Kim

[57]                 ABSTRACT

A chip-size semiconductor package and fabrication method is provided that reduces the size of the package. Further, the electrical path from the chip pads to the external leads is reduced to improve electrical characteristics. In addition, the external leads can be formed directly at the location of the chip pads. The chip-size semiconductor package has a passivation film is formed on a semiconductor chip excluding the chip pads thereon. Inner ends of conductive wires are vertically coupled to corresponding chip pads, respectively. Then, the semiconductor chip is sealed with a molding resin excluding the outer ends of the conductive wires that protrude. The outer ends can be formed as external leads having a shape, such as circular external balls, based on the intended use.

7 Claims, 7 Drawing Sheets

CHIP-SIZE SEMICONDUCTOR PACKAGE

BACKGROUND OF THE INVENTION

1. Field of the Invention

The present invention relates to a semiconductor package and a fabrication method that minimizes the size of the semiconductor package almost to the size of a semiconductor chip and improves an electrical path between a chip pad and the outside to enhance electrical characteristics.

2. Background of the Related Art

In the construction of a related art semiconductor package, a semiconductor chip is fixedly bonded on a paddle of a lead frame. Then, the pads of the semiconductor chip and internal leads are electrically connected with conductive wires. Next, the entire structure is sealed with a molding resin. Finally, the external leads are formed to be of a predetermined shape depending on the intended use.

FIG. 1 is a cross-sectional view showing an SOJ (small outline J-lead) semiconductor package in which external leads 7 are formed in the shape of a letter "J". As shown in FIG. 1, internal leads 3 of a lead frame are bonded on a semiconductor chip using the strength of an adhesive tape 2. Further, chip pads 6 formed at the center of the top surface of a semiconductor chip 1 are connected with the internal leads 3 through conductive wires 4 using ultrasonic thermal compression bonding. Then, the semiconductor chip 1 and the internal leads 3, except for the external leads 7, are surrounded within a molding resin 5. Finally, then the external leads 7 are formed depending on the purpose of the user. The external leads shown in FIG. 1 are formed to be "J" leads.

In the related art semiconductor package, an electrical signal from the chip pads 6 formed on the semiconductor chip is transmitted outside the semiconductor package using the lead frame. However, the package size is relatively large in comparison with the semiconductor chip size. As the electrical path from the chip pads to the external leads become longer, the electrical characteristics decline and a semiconductor package with many pins is difficult to achieve.

To overcome the disadvantages of related art semiconductor packages using the lead frame, various kinds of semiconductor packages such as a chip-size semiconductor package have been developed.

FIG. 2 shows a plastic molded extended bump (PMEB) type chip-size semiconductor package. In FIG. 2, a metal wiring pattern 13 is formed to connect a plurality of chip pads 12 formed on the semiconductor chip 11 with internal bump bonding pads 17. On the internal bump bonding pads 17 are bonded conductive internal bumps 16. On the top surfaces of the conductive internal bumps are bonded tapes (not illustrated). Then, the semiconductor chip 11 is surrounded within a molding resin 14. By removing the tapes (not illustrated), the top surfaces of the internal bumps 16 are exposed. After applying a solder paste to the internal bumps 16, conductive external solder balls 15 are put thereon and bonded with the internal bumps 16 through an infrared reflow process. Such a PMEB-type chip size semiconductor package was described at the "SEMICON JAPAN '94 SYMPOSIUM" held by the MITSUBISHI corporation in Japan on Dec. 2, 1994.

FIG. 3 is a cross-sectional view of a bump electrode in FIG. 2. The chip pads 12 are formed on a top surface of the semiconductor chip 11. A passivation film 18 that protects the chip 11 is formed on the semiconductor chip 11 except on the top surface of the chip pads 12. The metal wiring pattern 13 is formed on the chip passivation film 18 having one end connected to the chip pads 12 and the other end connected to the bump bonding pads 17.

The metal wiring pattern (ball connecting pattern) for transmitting electrical signals from the chip pads 12 is formed through a separate pre-assembly formation process. That is, the metal wiring pattern 13 is formed to electrically connect the chip pads 12 of the semiconductor chip 11 of the semiconductor chip 11 to the internal bump connecting pads 17. A polyimide film 19 is formed on the above construction except the internal bump bonding pads 17. Next, the internal bumps 16 are bonded on the exposed internal bump bonding pads 17 by means of a solder adhesive 20 composed of Pb or Sn. Then, the molding resin 14 seals the semiconductor chip 11 by surrounding the entire surface of the above construction except for the top surface of the internal bumps 16. Finally, the external balls 15, which serve as external leads, are bonded on the internal bumps 16 to complete the chip-size semiconductor package fabrication.

The overall size of the PMEB-type chip-size semiconductor package relative to the related art SOJ semiconductor package is smaller. Further, the PMEB-type semiconductor package has a relatively shorter electrical path, which improves the chip's electrical characteristics. However, a separate formation process, which is a pre-assembly process, is necessary for the metal wiring pattern. Further, the electrical path from the chip pads of the semiconductor package to the external solder balls remains relatively long.

The above references are incorporated by reference herein where appropriate for appropriate teachings of additional or alternative details, features and/or technical background.

SUMMARY OF THE INVENTION

An object of the present invention is to substantially obviate one or more of the problems caused by limitations and disadvantages of the related art.

It is another object of the present invention to minimize the size of a semiconductor package.

It is yet another object of the present invention to form a short electrical path to transmit an electrical signal from the semiconductor chip to outside the semiconductor package.

It is still yet another object of the present invention to improve the electrical characteristics of a chip encased in the semiconductor package, and in particular, a chip having a high number of pins.

To achieve the above objects, there is provided a chip-size semiconductor package and method where a chip-size semiconductor package includes a semiconductor chip; a plurality of chip pads formed in the semiconductor chip; a plurality of conductive wires extending from an inner end, which is vertically coupled to a corresponding one of the plurality of chip pads, to an outer end; and a molding resin packaging the semiconductor chip, the chip pads and the inner ends of the conductive wires.

The chip pads of the semiconductor chip and inner ends of the conductive wires can be coupled by ultrasonic thermal compression bonding, for example. Further, the outer ends of the conductive wires may be formed as circular balls by using techniques such an arc discharge and straight types of external leads can be formed by compressing the outer ends of the conductive wires with a bond head, for example. In addition, the other ends of the conductive wires can be left to protrude out of the molding resin without any further processing.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements and wherein.

DETAILED DESCRIPTION OF PREFERRED EMBODIMENTS

Figure 1:
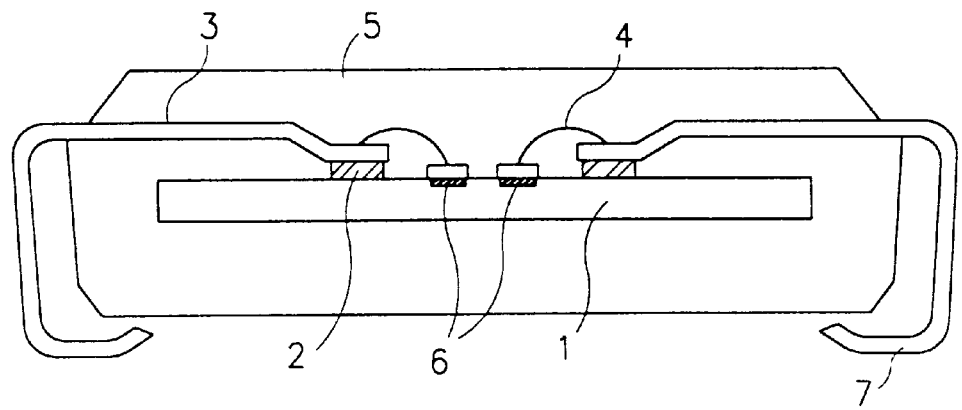
FIG. 1 is a diagram showing a cross-sectional view of a related art SOJ semiconductor package.
Figure 2:
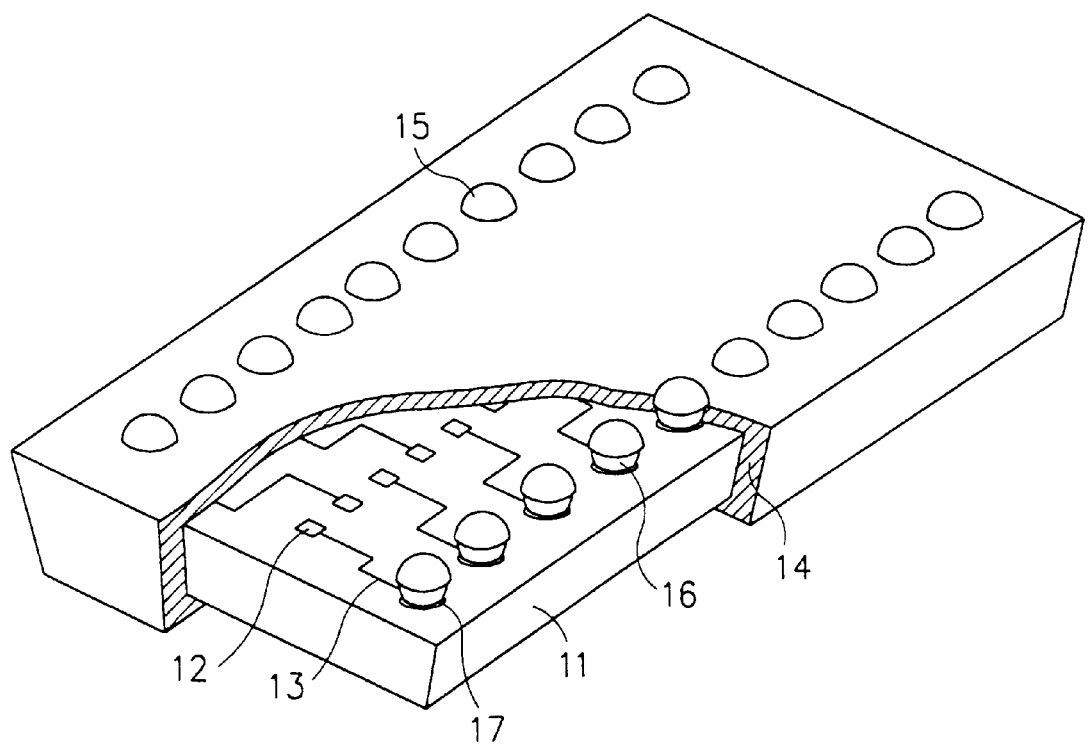
FIG. 2 is a diagram showing a perspective view of a cut-away related art PMEB (Plastic Molded Extended Bump) type chip-size semiconductor package.
Figure 3:
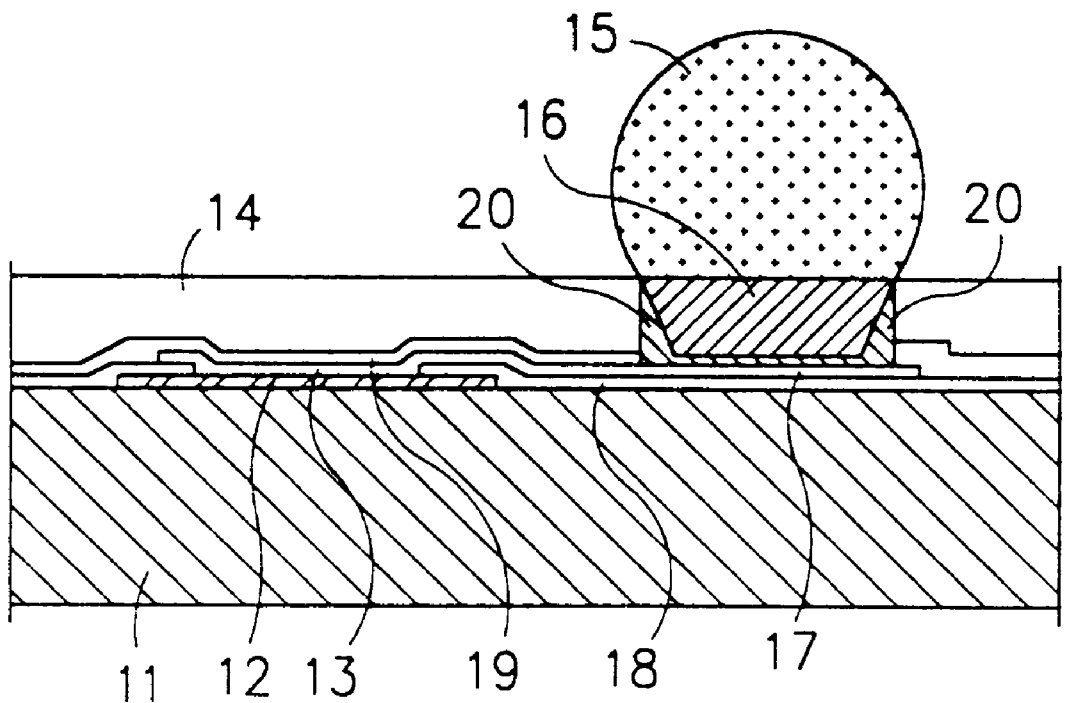
FIG. 3 is a diagram showing a cross-sectional view of a bump electrode of FIG. 2.
Figure 4:
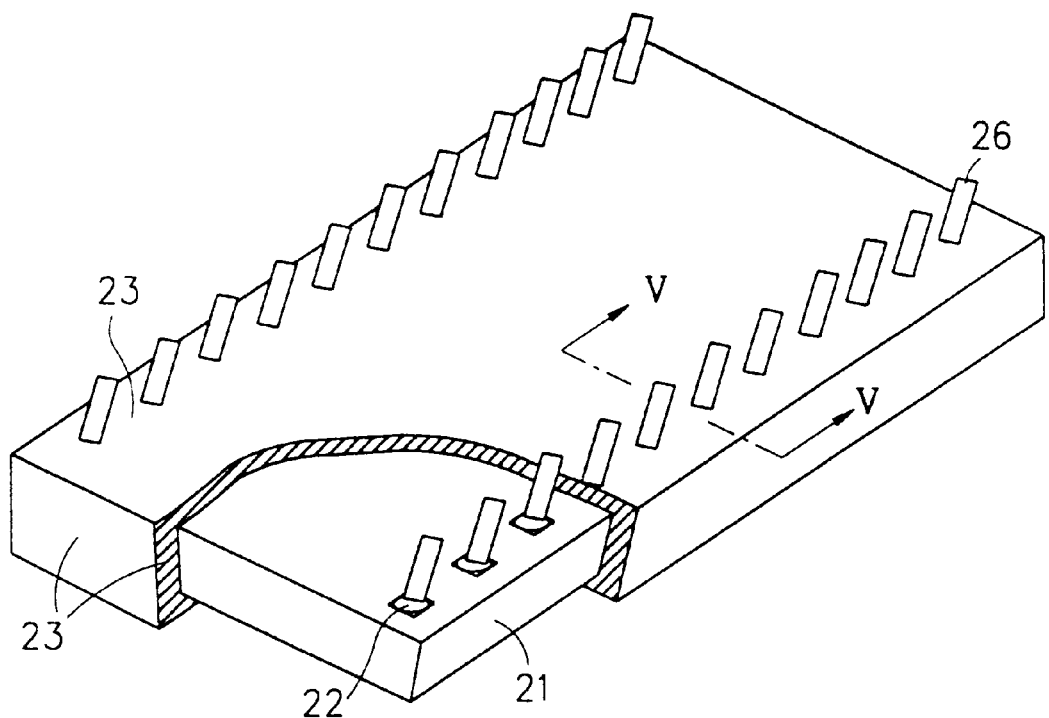
FIG. 4 is a diagram showing a perspective view of a cut-away chip-size semiconduct package according to an embodiment of the present invention.

A first preferred embodiment of a chip-size semiconductor package according to the present invention will now be described. As shown in FIG. 4, a plurality of chip pads 22 of a semiconductor chip 21 are respectively coupled to inner ends of conductive wires 26. Preferably, the inner ends of the conductive wires are vertically standing on the chip pads 22. Further, the entire semiconductor chip 21 except for outer ends of the conductive wires 26 is sealed with a molding resin 23. As shown in FIG. 4, the chip pads 22 are arranged in a longitudinal direction at the lengthwise sides of the semiconductor chip 21. The outer ends of the conductive wires 26 protruding out of the molding resin 23 are also arranged in the longitudinal direction at the sides of the completed semiconductor package.

The semiconductor package and method for the chip pads 22 and the conductive wires 26 shown in FIG. 4 will now be described.

Figure 5:
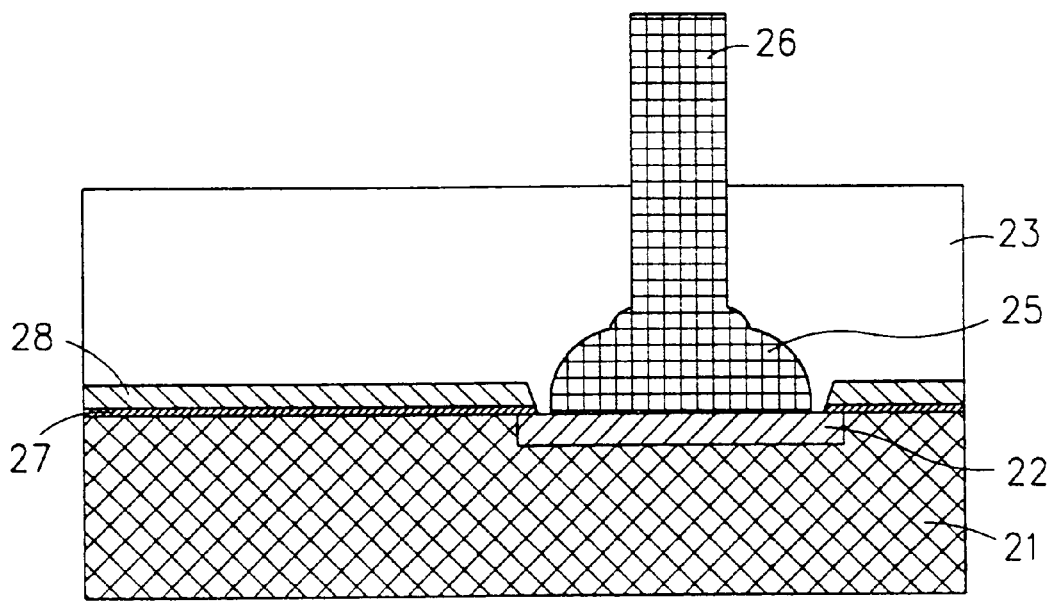
FIG. 5 is a diagram showing a cross-sectional view along line V—V in FIG. 4.

As shown in FIG. 5, the chip pads 22 are formed in the semiconductor chip 21. Then, a passivation film 27 is formed on the semiconductor chip 21 excluding the chip pads 22. On the passivation film 27 is formed a PIQ film 28 composed of a polyimide resin. In addition, the inner end of each of the conductive wires 26 is coupled to a respective one of the chip pads 22. The inner end of the conductive wire 26 and the chip pad 22 are bonded, preferably through a ultrasonic thermal compression bonding. The ends of the conductive wires 26 bonded on the chip pads 22 are bonding balls 25 of irregular oval shapes as formed by the thermal compression. Then, the entire semiconductor chip 21, excluding the outer ends of the conductive wires 26, is preferably surrounded and sealed with the molding resin 23 to protect the semiconductor chip 21 and the conductive wires 26. However, the packaging of the semiconductor chip is not intended to be limited to entirely surrounding the chip 21. For example, only the top surface of the chip 21 could be sealed by the molding resin 23. As shown in FIGS. 4–5, the outer ends of the conductive wires 26 protruding out of the molding resin 23 can be external leads that are used to transmit electrical signals to and from the chip pads 22.

Figure 6:
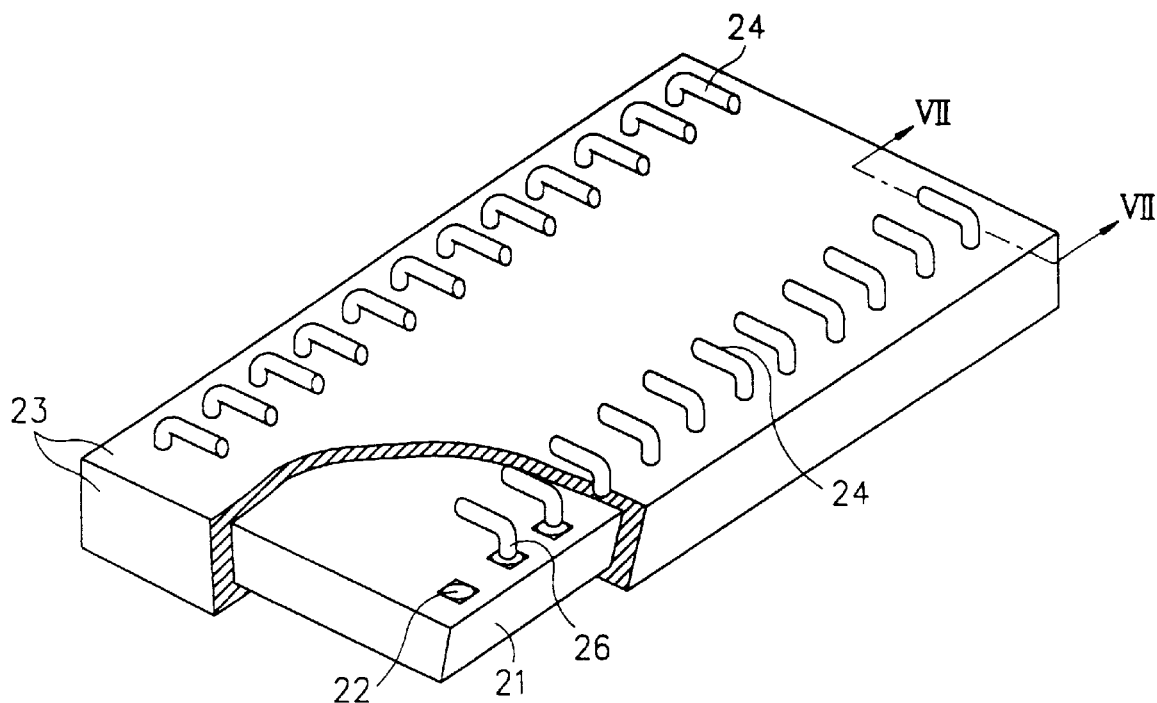
FIG. 6 is a diagram showing a perspective view of a cut-away chip-size semiconductor package according to another embodiment of the present invention.

A second preferred embodiment of a chip-size semiconductor package according to the present invention will now be described. As shown in FIG. 6, the inner ends of the conductive wires 26 are respectively coupled to corresponding ones of the plurality of chip pads 22 formed in the semiconductor chip 21. Further, the entire semiconductor chip 21 excluding the outer ends of the conductive wires 26 are sealed with the molding resin 23. In addition, the outer ends of the conductive wires 26 protruding out of the molding resin 23 are bent downwardly by compression to be directed toward the central portion of the semiconductor chip 21 and form external leads 24 in the shape of ].

Figure 7:
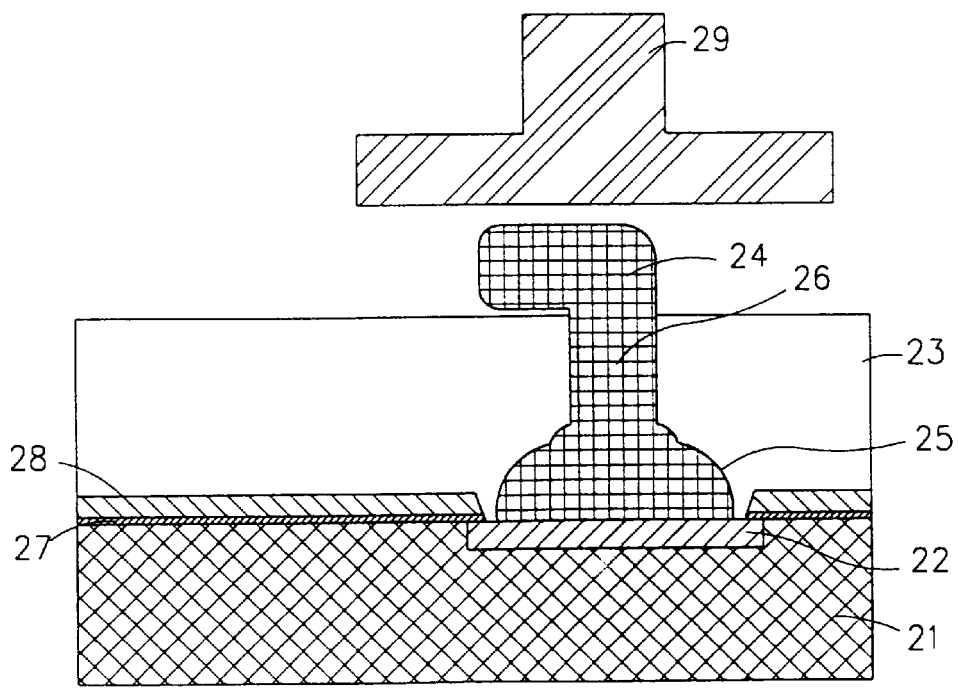
FIG. 7 is a diagram showing a cross-sectional view along line VII—VII in FIG. 6.

As shown in FIG. 7, the chip pads 22 are formed in the semiconductor chip 21, the passivation film 27 is formed on the semiconductor chip 21 excluding the chip pads 22, and the PIQ film 28 is formed on the passivation film 27. The inner ends of the conductive wires 26 and the chip pads 22 are coupled through the ultrasonic thermal compression bonding. The inner ends of the conductive wires 26 bonded on the chip pads 22 are bonding balls 25 of irregular oval shapes as formed by the thermal compression. Then, the entire semiconductor chip 21 excluding the outer ends of the conductive wires 26 is surrounded with the molding resin 23. The molding resin 23 protects the coupled portion of the semiconductor chip 21, the inner ends of the conductive wires 26 and the chip pads 22.

The outer ends of the conductive wires 26 protruding out of the molding resin 23 are bent toward the central portion of the semiconductor chip 21 to serve as the external leads 24. Preferably, the external leads are bent downwardly by compression using a bonding head 29 to form the external leads 24 in the shape of ] or to form the external leads in the shape of a "T" (not illustrated) having an upper portion parallel with the surface of the molding resin 23.

Figure 8:
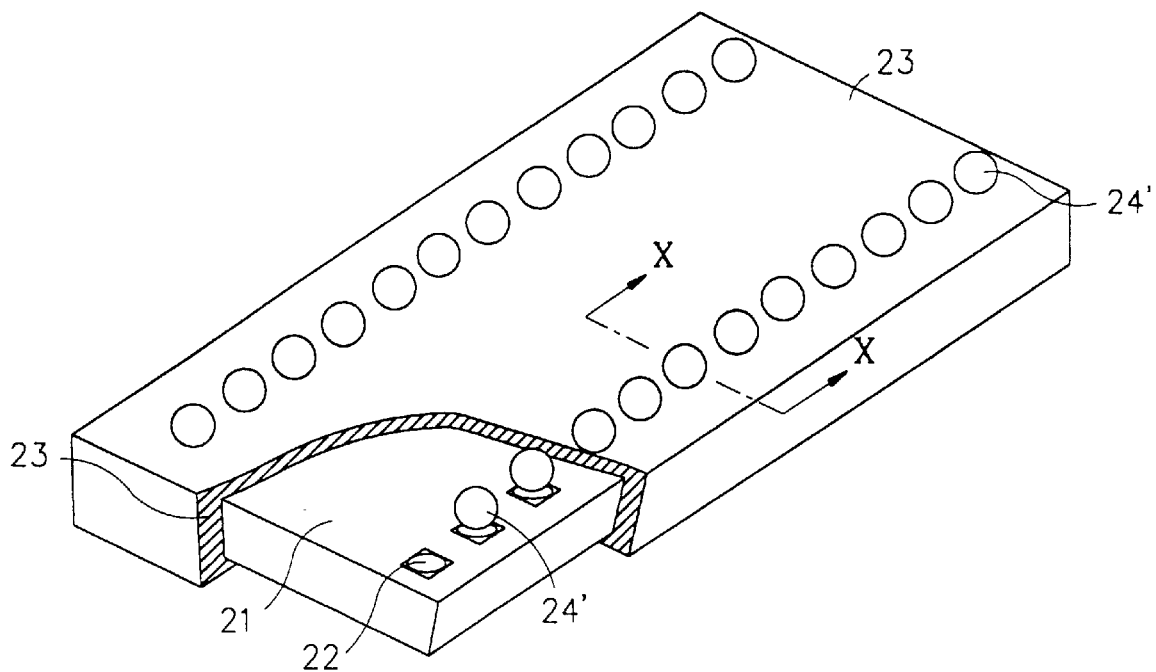
FIG. 8 is a diagram showing a perspective view of a cut-away chip-size semiconductor package according to yet another embodiment of the present invention.

A third preferred embodiment of a chip-size semiconductor package according to the present invention will now be described. As shown in FIG. 8, external balls 24' are external leads coupled to the plurality of chip pads 22, and the entire semiconductor chip 21 excluding the circular external balls 24' are encapsulated with the molding resin 23. The chip pads 22 are arranged in the longitudinal direction at the lengthwise sides of the semiconductor chip 21. Accordingly, the external balls 24' coupled to the chip pads 22 are also arranged in the longitudinal direction at the sides of the semiconductor package.

Figure 9:
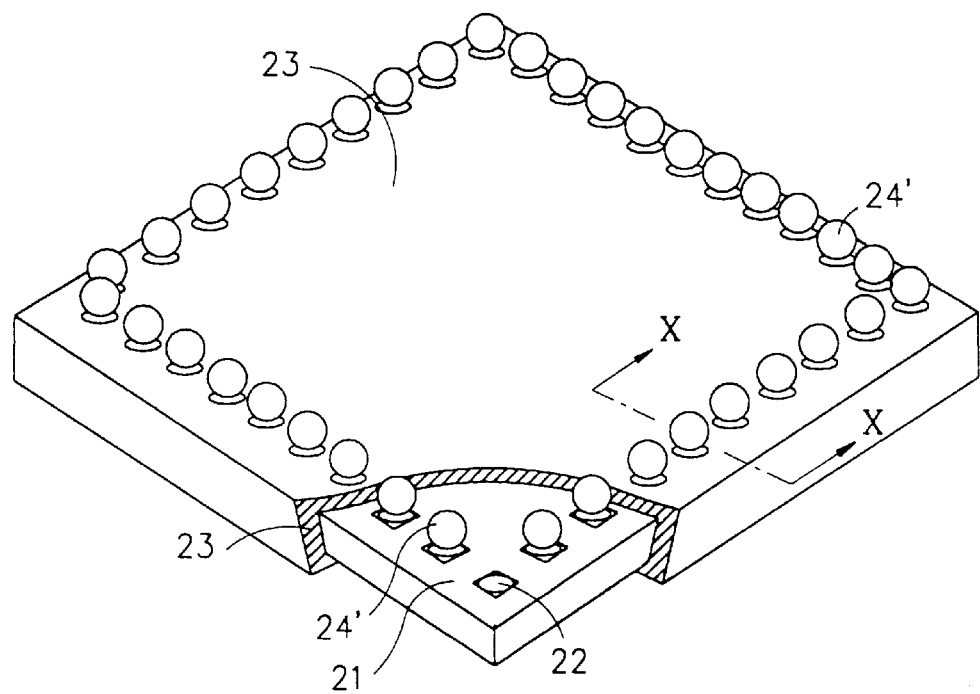
FIG. 9 is a diagram showing a perspective view of a cut-away chip-size semiconductor package according to still yet another embodiment of the present invention.

A fourth preferred embodiment of a chip-size semiconductor package according to the present invention will now be described. In FIG. 9, the external balls 24' are formed along all four sides of the top surface of the package, which differs relative to the third preferred embodiment. In the third pictured embodiment of FIG. 8, the external balls 24' are formed along two sides of the top surface of the package.

The semiconductor package and method of the chip pads 22 and the external balls 24' in the chip-size semiconductor package according to the third and fourth preferred embodiments will be described with reference to FIG. 10.

Figure 10:
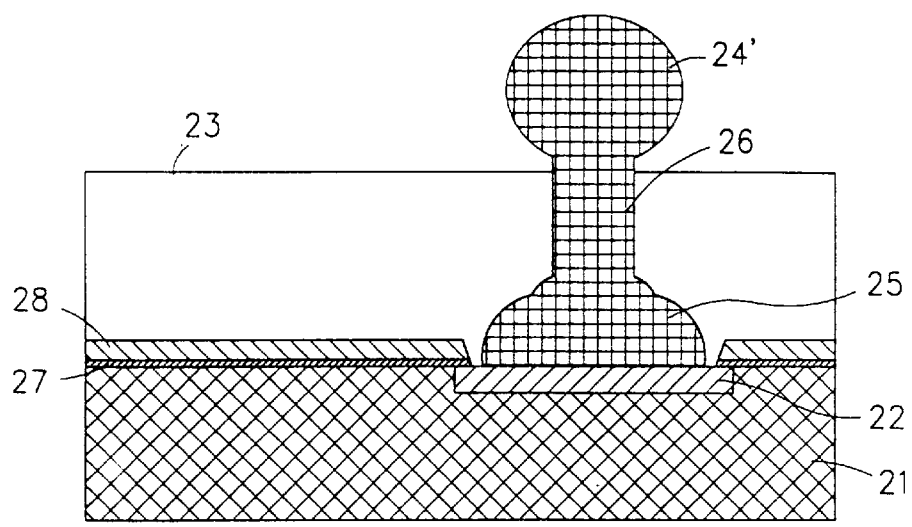
FIG. 10 is a diagram showing a cross-sectional view along line X—X in FIGS. 8 and 9.

As shown in FIG. 10, the outer ends of the conductive wires 26 of the fourth preferred embodiment differ from the first preferred embodiment. The outer ends of the conductive wires 26 protruding out of the molding resin 23 are preferably formed to the circular shape of the external balls 24' using an arc discharge. The circularly shaped external balls 24' serve as external leads for transmitting electrical signal to and from the chip pads.

The shapes of the outer ends of the conductive wires 26 protruding out of the molding resin 23 to serve as external leads differ in the above-described preferred embodiments. However, the present invention is not intended to be limited to only a vertical, "]" shaped or a circular ball shape as exemplified by the preferred embodiments of the present invention. The shapes of the external leads are changeable depending on the intended use.

In addition, the location of the vertical protrusion-type conductive wires 26 serving as external leads in FIG. 4, the "]" shaped external leads 24 in FIG. 6 and the circular ball shape of external balls 24' in FIG. 8 are changeable according to the location of the plurality of chip pads 22 formed in the semiconductor chip 21. The location of the chip pads 22 and corresponding external leads is not intended to be limited to the location disclosed in the preferred embodiments described above.

A preferred fabrication method for the chip-size semiconductor package according to the first preferred embodiment of the present invention will now be described with reference to FIGS. 11A–11D.

Figure 11A:
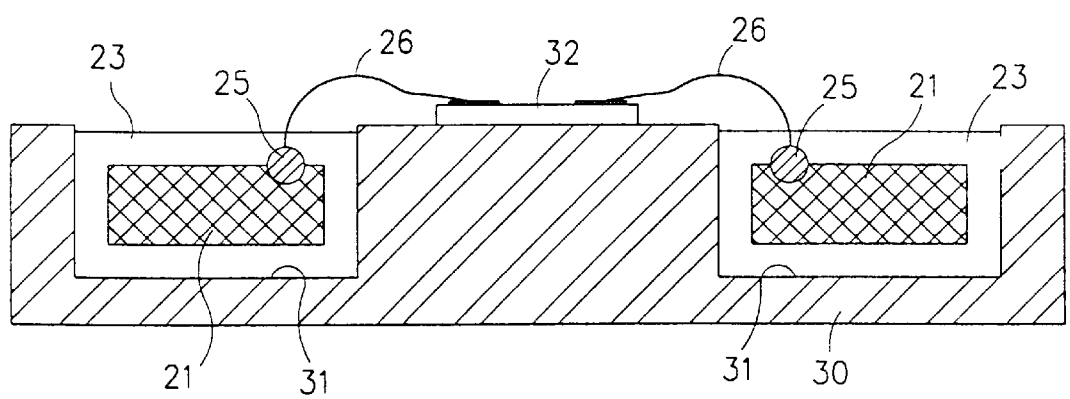
FIGS. 11A–11C are diagrams showing a fabrication method for the semiconductor package of FIG. 4.

First, there is provided a mold 30, as shown in FIG. 11A. The mold 30 has a plurality of cavities 31 for receiving a corresponding semiconductor chip 21. A metal plate 32 is formed on a top surface of the mold 30 between two cavities 31. The inner ends of the plurality of conductive wires 26 are coupled to the top surface of the metal plate 32.

A semiconductor chip 21 is placed in each cavity 31 of the mold 30, and the outer ends of the conductive wires 26 are coupled to the chip pads (not illustrated) formed on the top surface of the semiconductor chip 21 preferably using the ultrasonic thermal compression bonding. As a result, the outer ends of the conductive wires 26 are bonded on the chip pads 22 as irregular oval shapes of the bonding balls 25.

Next, the semiconductor chip 21 is molded by filling the cavities 31 with the molding resin 23. The top surface of the molding resin 23 is planarized by revolving the mold 30 at a predetermined speed. Then, the molding resin 23 is hardened.

Figure 11B:
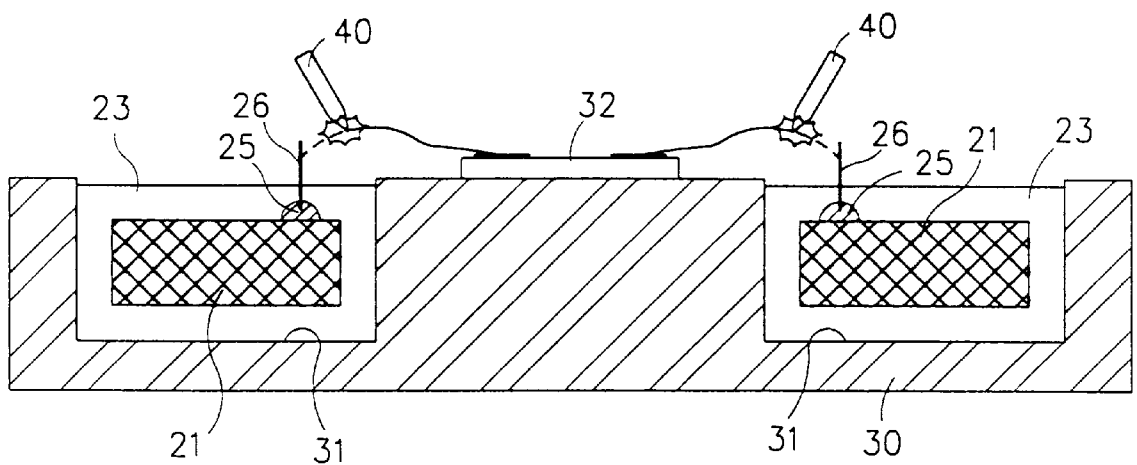

As shown in FIG. 11B, a spark caused by contacting an electrode 40 with a predetermined position of the conductive wires 26 is used to separate a remaining portion of the conductive wires 26 from the metal plate 32. Preferably, the predetermined position is approximately at the middle of the length of the conductive wires 26. The separated remaining portion of the conductive wires 26 flexes to stand perpendicularly to the chip pads 22 because of the elasticity of the conductive wires 26.

Figure 11C:
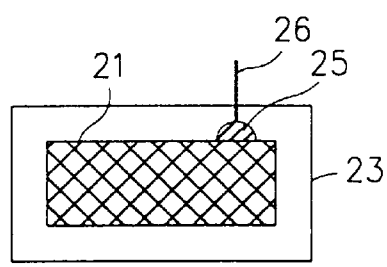

After carrying out the above process, the molded semiconductor chip 21 is separated from the mold 30 to complete the chip-size semiconductor package according to the first preferred embodiment, as shown in FIG. 11C.

Further, the ends of the conductive wires 26 protruding out of the molding resin 23 can be variously formed depending on the intended use. For example, the ends of the conductive wires 26 protruding out of the molding resin 23 can be formed as circular balls, or in the shape of an "L" or "T". Thus, the fabrication method for the chip-size semiconductor package according to the preferred embodiments can include coupling the chip pads formed in the semiconductor chip to inner ends of the conductive wires, cutting off the conductive wires to have a predetermined length, sealing the semiconductor chip with the molding resin excluding the outer ends of the conductive wires, and forming the outer ends of the conductive wires protruding out of the molding resin according to the intended use.

In the chip-size semiconductor package and the fabrication method, inner ends of the conductive wires are coupled to the chip pads formed in the semiconductor chip, the entire semiconductor chip is molded excluding the protruding ends of the conductive wires, and the protruding ends are formed depending on the intended use. Thus, a separate process for forming a wiring pattern is not necessary when manufacturing a small sized semiconductor package. Further, an external lead for transmitting electrical signals is provided directly at the chip pads. Thus, the electrical path becomes shorter, and consequently, the electrical characteristics can be improved. In addition, the semiconductor chip can be packaged, irrespective of the location of the chip pads.

It is to be understood that both the foregoing general description and the following detailed description are exemplary and explanatory. It will be apparent to those skilled in the art that various modifications can be made in the chip-size semiconductor package and method without departing from the spirit or scope of the present invention. It is intended that the present invention cover the modifications and variations of this invention that are within the scope of the appended claims and their equivalents.

What is claimed is:

1. A chip-size semiconductor package, comprising:

a semiconductor chip;

a plurality of chip pads formed in said semiconductor chip;

a plurality of gold conductive wires, each of said wires extending from an inner end, which is substantially vertically coupled to a corresponding one of said plurality of chip pads, to an outer end; and a molding resin packaging the semiconductor chip, said chip pads and said inner ends of the conductive wires, wherein said outer ends of the conductive wires protrude out of the molding resin, and wherein the protruding portions of the wires are bent in the shape of an "L" and are directed towards a central portion of the semiconductor chip.

2. The semiconductor package of claim 1, wherein said each of said plurality of conductive wires are directly contacting said corresponding one of said plurality of chip pads.

3. The semiconductor package of claim 1, wherein only the outer ends of said conductive wires protrude from said molding resin.

4. The semiconductor package of claim 1, wherein said inner ends of the conductive wires are bonded on the chip pads using thermal compression bonding.

5. The semiconductor package of claim 4, wherein said inner ends are formed as bonding balls having irregular oval shapes.

6. The semiconductor package of claim 1, wherein said outer ends of the conductive wires are formed as circular balls.

7. The semiconductor package of claim 1, wherein said molding resin packaging surrounds the entire semiconductor chip, said chip pads and said inner ends.

\* \* \* \* \*